United States Patent
Otsubo

(10) Patent No.: US 10,524,352 B2
(45) Date of Patent: Dec. 31, 2019

(54) RESIN MULTILAYER SUBSTRATE

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/180,054

(22) Filed: Nov. 5, 2018

(65) Prior Publication Data

US 2019/0075649 A1 Mar. 7, 2019

Related U.S. Application Data

(63) Continuation of application No. PCT/JP2017/016974, filed on Apr. 28, 2017.

(30) Foreign Application Priority Data

Jun. 2, 2016 (JP) ................. 2016-111169

(51) Int. Cl.
  H05K 1/18 (2006.01)
  H05K 1/02 (2006.01)
  H05K 1/11 (2006.01)

(52) U.S. Cl.
  CPC .......... H05K 1/0222 (2013.01); H05K 1/0298 (2013.01); H05K 1/115 (2013.01)

(58) Field of Classification Search
  CPC ................. H05K 1/181; H05K 1/185
  See application file for complete search history.

(56) References Cited

U.S. PATENT DOCUMENTS

| 2004/0091687 | A1 | 5/2004 | Kondo et al. |
| 2011/0147072 | A1* | 6/2011 | Yamashita ............ C23F 1/02 174/268 |
| 2012/0037404 | A1* | 2/2012 | Hsu ............ H01L 23/49822 174/252 |

FOREIGN PATENT DOCUMENTS

| JP | 2003-086949 A | 3/2003 |
| JP | 2003-347738 A | 12/2003 |

OTHER PUBLICATIONS

Official Communication issued in International Patent Application No. PCT/JP2017/016974, dated May 30, 2017.

* cited by examiner

*Primary Examiner* — Jeremy C Norris
(74) *Attorney, Agent, or Firm* — Keating & Bennett, LLP

(57) ABSTRACT

A resin multilayer substrate includes a multilayer body including resin layers mainly made of thermoplastic resin and that are laminated, a first component incorporated in the multilayer body and including a first component terminal, a second component incorporated in the multilayer body, including a second component terminal, spaced away from the first component as seen from a laminating direction of the multilayer body, a first conductive via electrically connected to the first component terminal and overlapping the first component terminal as seen from the laminating direction of the multilayer body, and a plurality of second conductive vias not aligned with the first conductive via, disposed closer to the second component, disposed at heights different from a height of the first conductive via, and electrically connected to the first conductive via.

13 Claims, 6 Drawing Sheets

RESIN MULTILAYER SUBSTRATE

CROSS REFERENCE TO RELATED APPLICATIONS

This application claims the benefit of priority to Japanese Patent Application No. 2016-111169 filed on Jun. 2, 2016 and is a Continuation Application of PCT Application No. PCT/JP2017/016974 filed on Apr. 28, 2017. The entire contents of each application are hereby incorporated herein by reference.

BACKGROUND OF THE INVENTION

1. Field of the Invention

The present invention relates to resin multilayer substrates.

2. Description of the Related Art

A known technique for obtaining a resin multilayer substrate is stacking films made of thermoplastic resin to form a multilayer body and integrating them. The resin multilayer substrate may incorporate a component. One such example is described in Japanese Unexamined Patent Application Publication No. 2003-86949. The resin multilayer substrate may have a structure in which a plurality of conductive vias are connected in series along a laminating direction (hereinafter referred to as "serial via section") for causing wiring to extend from the incorporated component.

In the serial via section, the conductive vias and conductive patterns are electrically connected such that they are alternately linked. To the serial via section, breaks between the conductive vias and the conductive patterns may occur. Because the serial via section has higher stiffness than that of other sections (resin layers) in the multilayer body, the coplanarity of the top surface of the multilayer body may degrade when the multilayer body is pressed for integration. If the coplanarity of the top surface degrades, when mounting a component on the surface, the component may be mounted improperly. If a narrow interval is set between incorporated components, the shape of one or more serial via sections may be distorted at the time of pressing for integration of the multilayer body, the plurality of serial via sections may come into contact with each other, and this may cause electrical short circuits. In addition, because the incorporated components also have higher stiffness than that of the resin layers in the multilayer body, for the same reason, electrical short circuiting caused by contact between the components is also a problem.

Because the serial via sections, incorporated components, and other elements, have high stiffness, the coplanarity of the top surface of the multilayer body may degrade in the area in which such serial via sections, incorporated components, and other elements are disposed at the time of pressing for integration of the multilayer body. If the coplanarity of the top surface degrades, when mounting a component on the top surface, the component may be mounted improperly.

SUMMARY OF THE INVENTION

Preferred embodiments of the present invention provide resin multilayer substrates in each of which electrical short circuiting caused by contact between serial via sections arising from distortion or tilting of one or more serial via sections or electrical short circuiting caused by contact between components is prevented, and the occurrence of breaks in the serial via sections is prevented.

A resin multilayer substrate according to a preferred embodiment of the present invention includes a multilayer body including a plurality of resin layers mainly made of thermoplastic resin that are laminated, a first component, a second component, a first conductive via, and a plurality of second conductive vias. The first component is incorporated in the multilayer body and includes a first component terminal. The second component is incorporated in the multilayer body, includes a second component terminal, and is spaced away from the first component as seen from a laminating direction of the multilayer body. The first conductive via is electrically connected to the first component terminal and overlaps the first component terminal as seen from the laminating direction of the multilayer body. The plurality of second conductive vias are not aligned with the first conductive via, are closer to the second component, are at heights different from the first conductive via, and are electrically connected to the first conductive via.

According to the above-described preferred embodiment, electrical short circuiting caused by contact between serial via sections arising from distortion or tilting of one or more serial via sections or electrical shortings caused by contact between components is prevented. As a result of flexibility in the serial via sections, the occurrence of breaks in the serial via sections is prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
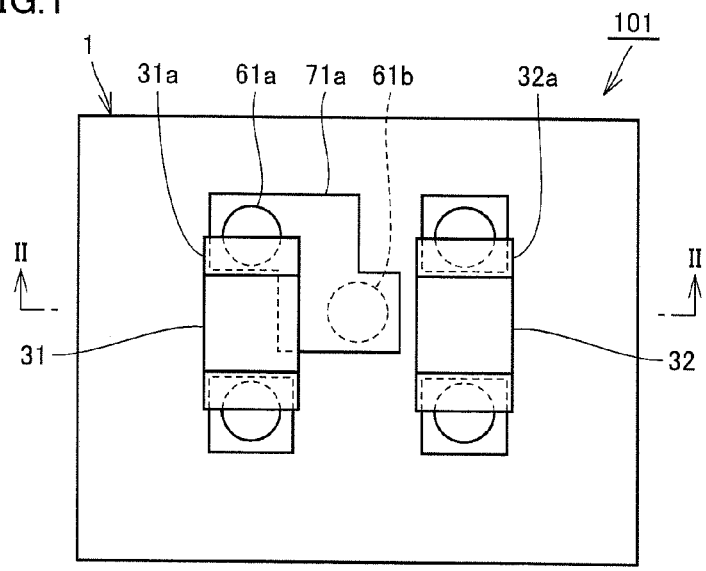
FIG. 1 is a see-through plan view of a resin multilayer substrate according to a first preferred embodiment of the present invention.

Preferred embodiments of the present invention will be described with reference to the drawings. The dimensional ratios illustrated in the drawings may not be true to the actual dimensional ratios, and they may be exaggerated for the sake of convenience of explanation. In the following description, when mention is made of the concept of upper, lower, top, or bottom, it may not indicate an absolute one, and it may indicate a relative one in illustrated orientations.

First Preferred Embodiment

Figure 2:
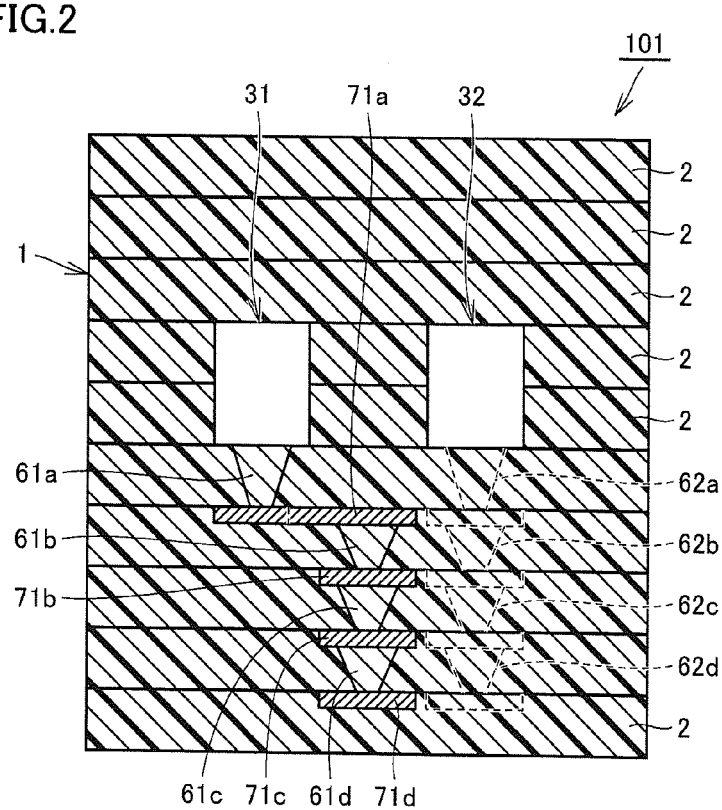
FIG. 2 is a cross-sectional view taken along the line II-II with arrows in FIG. 1.

A resin multilayer substrate according to a first preferred embodiment of the present invention will be described with reference to FIGS. 1 and 2. FIG. 1 illustrates a see-through plan view of a resin multilayer substrate 101 according to the present preferred embodiment. The incorporated components are not seen when the resin multilayer substrate 101 is simply viewed from the upper side, that is, one side of the laminating direction because they are covered with resin layers. For the sake of convenience of explanation, FIG. 1 illustrates the resin multilayer substrate 101 such that a first component 31, a second component 32, a conductive pattern 71a, and other elements, which are hidden because they are covered with the resin layers, are visible. The same applies to the plan views illustrated in the preferred embodiments described below. FIG. 2 illustrates a cross-sectional view taken along the line II-II with arrows in FIG. 1.

The resin multilayer substrate 101 in the present preferred embodiment includes a multilayer body 1, the first component 31, the second component 32, a conductive via 61a (a first conductive via), and conductive vias 61b, 61c, and 61d (a plurality of second conductive vias). The multilayer body 1 includes a plurality of resin layers 2 mainly made of thermoplastic resin that are laminated. The first component 31 is incorporated in the multilayer body 1 and includes a first component terminal 31a. The second component 32 is incorporated in the multilayer body 1, includes a second component terminal 32a, and is spaced away from the first component 31 as seen from the laminating direction of the multilayer body 1. The conductive via 61a is electrically connected to the first component terminal 31a and overlaps the first component terminal 31a as seen from the laminating direction of the multilayer body 1. The conductive vias 61b, 61c, and 61d are not aligned with the first conductive via, are closer to the second component 32, are positioned at heights different from the first conductive via, and are electrically connected to the first conductive via.

The first component terminal 31a and the conductive via 61a are directly connected to each other without a planar conductive pattern interposed therebetween. The lower end of the conductive via 61a is connected to the planar conductive pattern 71a. The lower surface of the conductive pattern 71a is connected to the conductive via 61b. That is, the planar conductive pattern 71a defines and functions as an extending conductor to connect the conductive via 61a as the first conductive via and the conductive via 61b, which are not aligned with the first conductive via and are closer to the second component 32. The lower end of the conductive via 61b is connected to the conductive via 61c with a conductive pattern 71b interposed therebetween. Furthermore, the lower end of the conductive via 61c is connected to the conductive via 61d with a conductive pattern 71c interposed therebetween. The lower end of the conductive via 61d is connected to a conductive pattern 71d. The conductive patterns 71b, 71c, and 71d define and function as pad conductors to connect the conductive vias. Thus, the conductive vias 61b, 61c, and 61d are continuous linearly disposed. The number of second conductive vias is not limited to three and may be two, four, or more.

In the present preferred embodiment, a serial via section that includes the conductive via 61a (the first conductive via) and the conductive vias 61b, 61c, and 61d (the second conductive vias) extends from the first component 31. Because the conductive vias 61b, 61c, and 61d are not aligned with the conductive via 61a and are closer to the second component 32, the overlapping of the serial via section, which has higher stiffness than that of the other portions in the multilayer body 1, with the first component 31 in the laminating direction is reduced or prevented. In the present preferred embodiment, a portion of the serial via section is positioned between the first component 31 and second component 32 as seen from the laminating direction. Accordingly, at the time of pressing to integrate the multilayer body, an unbalanced state of the pressure applied inside the multilayer body is reduced or prevented. That is, although the components (first component 31, second component 32), and the serial via section have higher stiffness than that of the other portions (for example, resin layers) in the multilayer body 1 and the pressure applied inside the multilayer body at the time of pressing to integrate the multilayer body tends to be unbalanced, the arrangement of at least some of the portion with high stiffness between the plurality of components (first component 31, second component 32) makes the pressure balanced. Thus, contact between the serial via sections caused by tilting of one or more serial via sections and contact between the components caused by tilting of one or more components is prevented. Accordingly, undesired electrical short circuiting is prevented.

The arrangement in which the serial via section does not overlap the other portions in a portion thereof as seen from the laminating direction enables the coplanarity of the top surface of the multilayer body to be less likely to degrade.

In the present preferred embodiment, the serial via section is disposed not only along the thickness direction and also includes the conductive vias 61b, 61c, and 61d, which are not aligned with the conductive via 61a and are closer to the second component 32. Thus, the serial via section is flexible as a whole. Because the serial via section is flexible as a whole, excessive load on the serial via section is able to be reduced or minimized, and breaks in wiring caused by the excessive load are able to be reduced or prevented.

As illustrated in the present preferred embodiment, at least one planar conductive pattern may preferably be provided between the first conductive via and one of the second conductive vias. Because of this configuration, the positions of the second conductive vias are able to be easily displaced from the position of the first conductive via.

Second Preferred Embodiment

Figure 3:
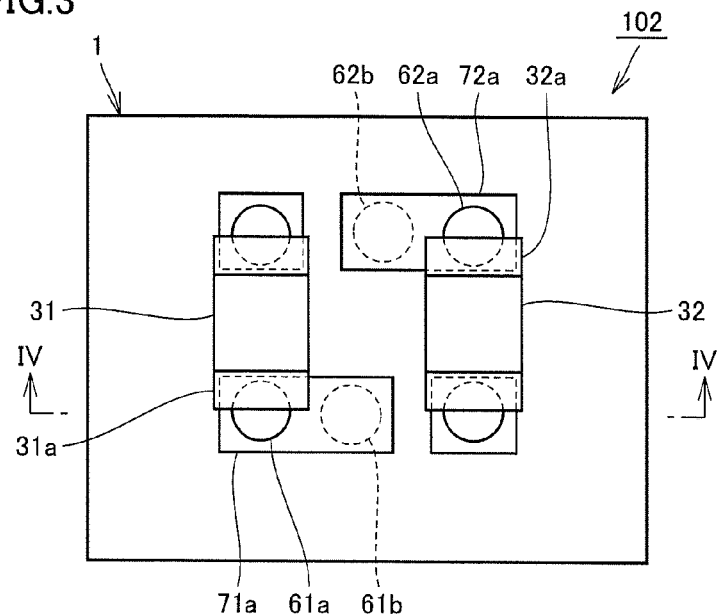
FIG. 3 is a see-through plan view of a resin multilayer substrate according to a second preferred embodiment of the present invention.
Figure 4:
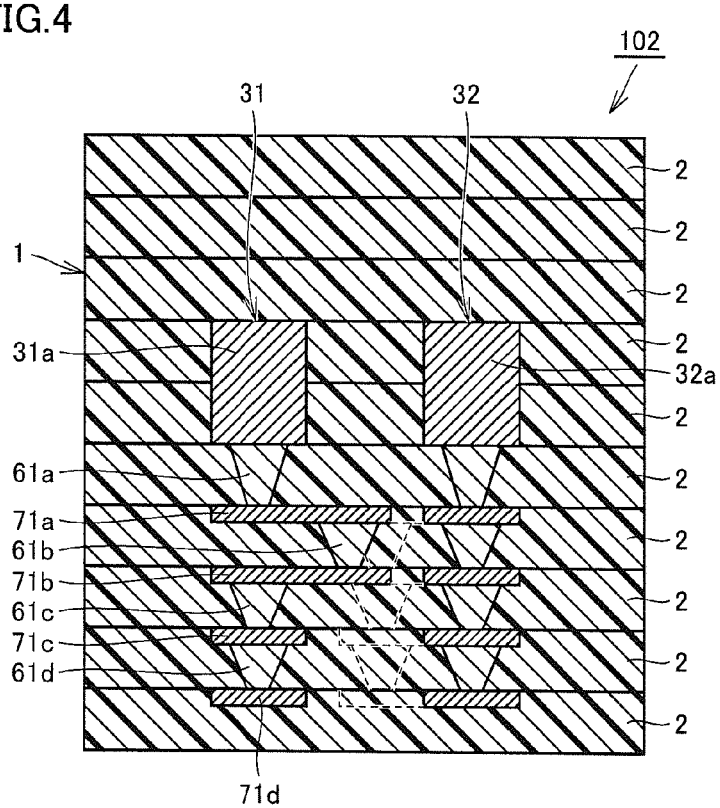
FIG. 4 is a cross-sectional view taken along the line IV-IV with arrows in FIG. 3.

A resin multilayer substrate according to a second preferred embodiment of the present invention will be described with reference to FIGS. 3 and 4. FIG. 3 is a see-through plan view of a resin multilayer substrate 102 according to the present preferred embodiment. FIG. 4 illustrates a cross-sectional view taken along the line IV-IV with arrows in FIG. 3.

The resin multilayer substrate 102 in the present preferred embodiment includes the multilayer body 1, the first component 31, the second component 32, the conductive vias 61a, 61c, and 61d (first conductive vias), and the conductive via 61b (a second conductive via). The multilayer body 1 includes the plurality of resin layers 2 mainly made of thermoplastic resin that are laminated. The first component 31 is incorporated in the multilayer body 1 and includes the first component terminal 31a. The second component 32 is incorporated in the multilayer body 1, includes the second component terminal 32a, and is spaced away from the first component 31 as seen from the laminating direction of the multilayer body 1. The conductive vias 61a, 61c, and 61d are electrically connected to the first component terminal 31a and overlap the first component terminal 31a as seen from the laminating direction of the multilayer body 1. The conductive via 61b is not aligned with the first conductive vias, is closer to the second component 32, is positioned at a height different from the first conductive vias, and is electrically connected to the first conductive vias. Thus, the conductive vias 61a, 61c, and 61d are discontinuously and linearly disposed.

The resin multilayer substrate 102 further includes a third conductive via 62a. The third conductive via 62a is electrically connected to the second component terminal 32a and overlaps the second component terminal 32a as seen from the laminating direction of the multilayer body 1. An end of the third conductive via 62a opposite to the end connected to the second component terminal 32a is connected to a conductive pattern 72a.

The resin multilayer substrate 102 may preferably further include a conductive via 62b (a fourth conductive via). The conductive via 62b is not aligned with the conductive via 62a (the third conductive via), is closer to the first component 31, is positioned at a height different from the third conductive via, and is electrically connected to the third conductive via. In this case, the number of fourth conductive vias may preferably be two or more, for example. That is, the plurality of conductive vias 62b (the fourth conductive vias) may preferably define a serial via section.

The presence of the third conductive via and fourth conductive vias is described above. The relationship between the first conductive via and the second conductive vias previously described may also be provided between the third conductive via and fourth conductive vias. For example, they may have the configuration illustrated in FIGS. 5 and 6, as described below.

As illustrated in FIG. 3, in the resin multilayer substrate 102, the first component 31 and the serial via section connected thereto have an L shape in plan view. The same applies to the second component 32 and the serial via section connected thereto. The two L shapes are in a point symmetry position and fit in with each other.

In the present preferred embodiment, the conductive vias 61a, 61c, and 61d overlap each other, and they also overlap the first component 31. Under these circumstances, pressure tends to be unbalanced. However, because the conductive via 61b, which is not aligned therewith and is closer to the second component 32, is included, the pressure is able to be balanced, and the coplanarity is able to be improved.

In the present preferred embodiment, in addition to the serial via section connected to the first component 31, the serial via section connected to the second component 32 also includes a portion that is not aligned. Thus, an unbalanced state of pressure applied inside the multilayer body at the time of pressing to integrate the multilayer body is able to be reduced or prevented. Accordingly, electrical short circuiting caused by contact between components is prevented. In the present preferred embodiment, in addition to the serial via section for the first component 31, the serial via section for the second component 32 is flexible. Thus, excessive load on the serial via sections is able to be reduced or minimized, and the occurrence of breaks in wiring caused by the excessive load is able to be reduced or minimized.

Third Preferred Embodiment

Figure 5:
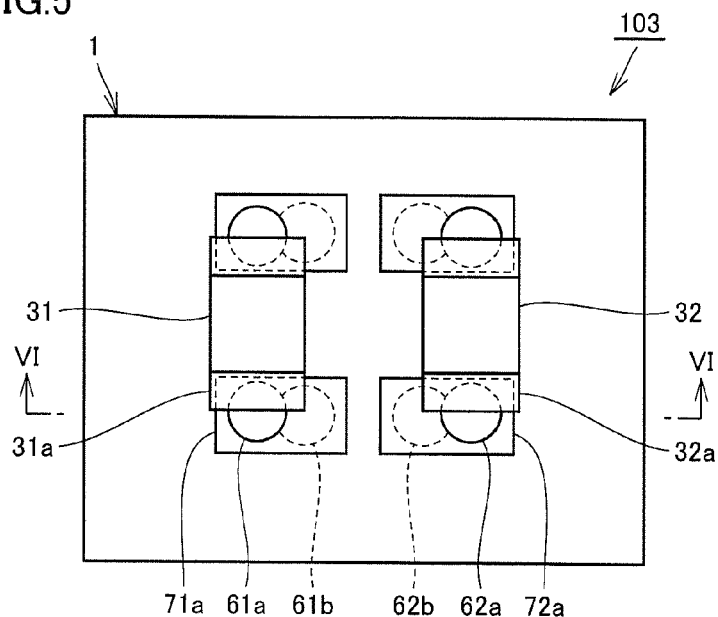
FIG. 5 is a see-through plan view of a resin multilayer substrate according to a third preferred embodiment of the present invention.
Figure 6:
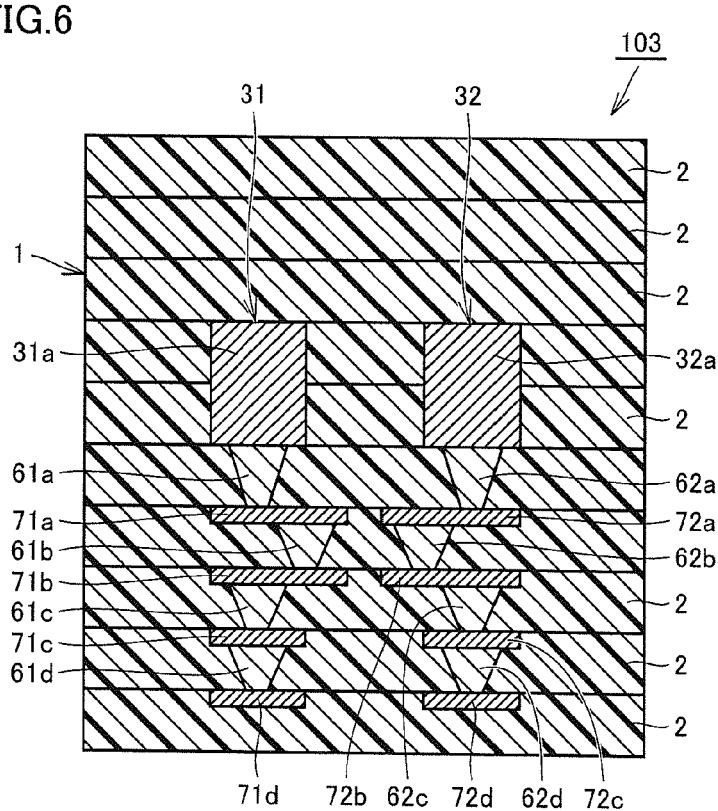
FIG. 6 is a cross-sectional view taken along the line VI-VI with arrows in FIG. 5.

A resin multilayer substrate according to a third preferred embodiment of the present invention will be described with reference to FIGS. 5 and 6. FIG. 5 is a see-through plan view of a resin multilayer substrate 103 according to the present preferred embodiment. FIG. 6 illustrates a cross-sectional view taken along the line VI-VI with arrows in FIG. 5. In the present preferred embodiment, serial via sections extend from a total of four terminals of two incorporated components.

In the present preferred embodiment, as illustrated in FIG. 5, the first component 31 and the two serial via sections connected thereto have a square U shape in plan view. The same applies to the second component 32 and the two serial via sections connected thereto. The two square U shapes are in a symmetrical position and opposed to each other.

The present preferred embodiment provides the same or substantially the same advantages as those in the second preferred embodiment.

Fourth Preferred Embodiment

Figure 7:
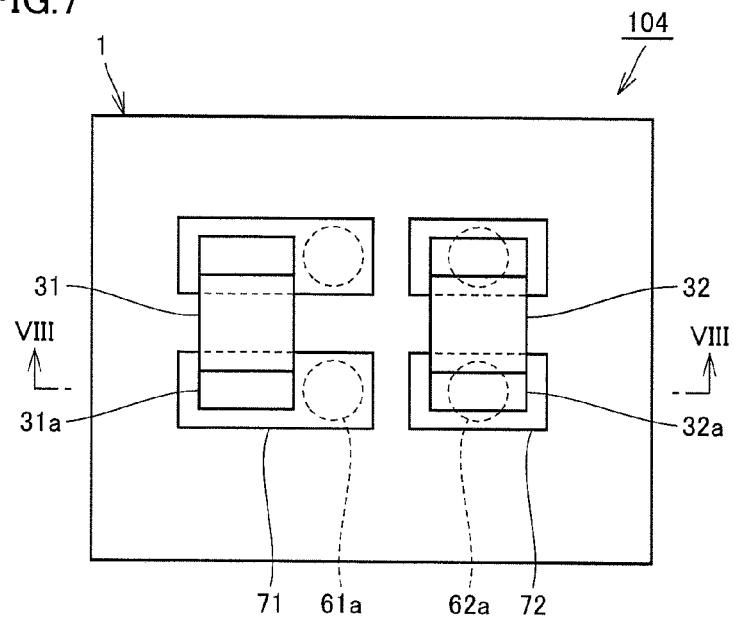
FIG. 7 is a see-through plan view of a resin multilayer substrate according to a fourth preferred embodiment of the present invention.
Figure 8:
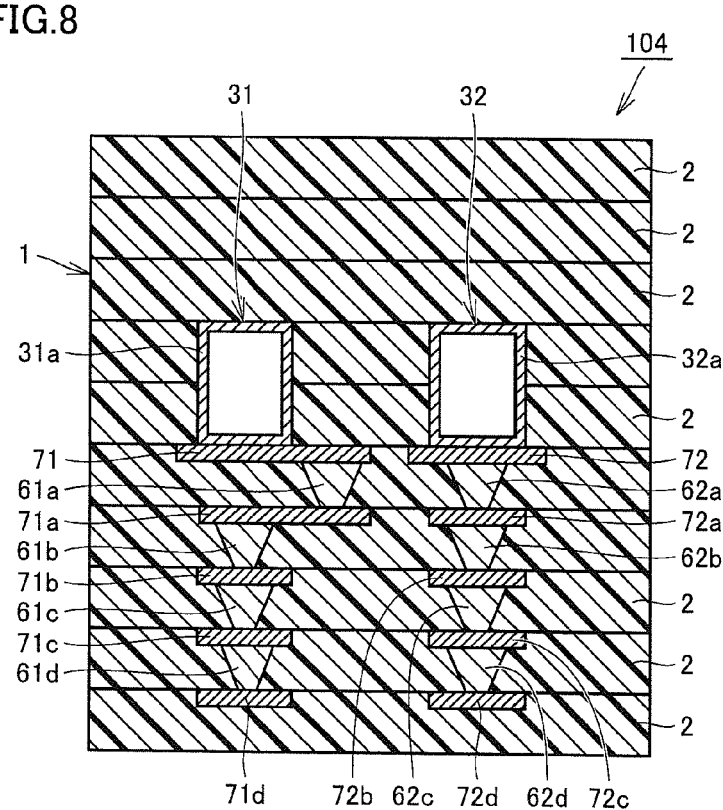
FIG. 8 is a cross-sectional view taken along the line VIII-VIII with arrows in FIG. 7.

A resin multilayer substrate according to a fourth preferred embodiment of the present invention will be described with reference to FIGS. 7 and 8. FIG. 7 is a see-through plan view of a resin multilayer substrate 104 according to the present preferred embodiment. FIG. 8 illustrates a cross-sectional view taken along the line VIII-VIII with arrows in FIG. 7.

As illustrated in FIG. 8, in the present preferred embodiment, a conductive pattern 71 is in contact with a lower surface of the first component terminal 31a of the first component 31, and the planar conductive pattern 71 is structured such that wiring extend laterally from the first component 31. The conductive via 61a (the second conductive via) is electrically connected to the lower surface of the conductive pattern 71. In the present preferred embodiment, the conductive via 61a is electrically connected to the first component terminal 31a with the conductive pattern 71 interposed therebetween, is not directly connected thereto, and does not overlap the first component terminal 31a as seen from the laminating direction of the multilayer body 1. The wiring is laterally extended from the lower end of the conductive via 61a by the conductive pattern 71a and is then returned to a position overlapping the first component terminal 31a. The conductive via 61b (one of the first conductive vias) overlaps the first component terminal 31a. The lower end of the conductive via 61b is connected to the conductive via 61c with the conductive pattern 71b interposed therebetween. The lower end of the conductive via 61c is connected to the conductive via 61d with the conductive pattern 71c interposed therebetween. The lower end of the conductive via 61d is connected to the conductive pattern 71d. The conductive vias 61b, 61c, and 61d (the first conductive vias) are disposed continuously and linearly.

A conductive pattern 72 is in contact with the lower surface of the second component terminal 32a in the second component 32. The lower surface of the conductive pattern 72 is connected to the conductive via 62a. The lower end of the conductive via 62a is connected to the conductive via 62b with the conductive pattern 72a interposed therebetween. The lower end of the conductive via 62b is connected to the conductive via 62c with a conductive pattern 72b interposed therebetween. The lower end of the conductive via 62c is connected to the conductive via 62d with a conductive pattern 72c interposed therebetween. The lower end of the conductive via 62d is connected to a conductive pattern 72d.

The present preferred embodiment provides the same or substantially the same advantages as those in the second preferred embodiment.

Fifth Preferred Embodiment

Figure 9:
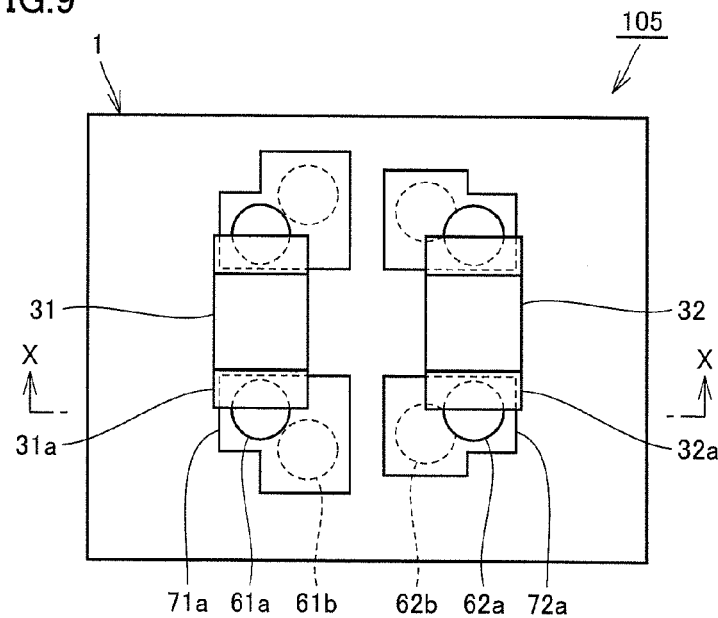
FIG. 9 is a see-through plan view of a resin multilayer substrate according to a fifth preferred embodiment of the present invention.
Figure 10:
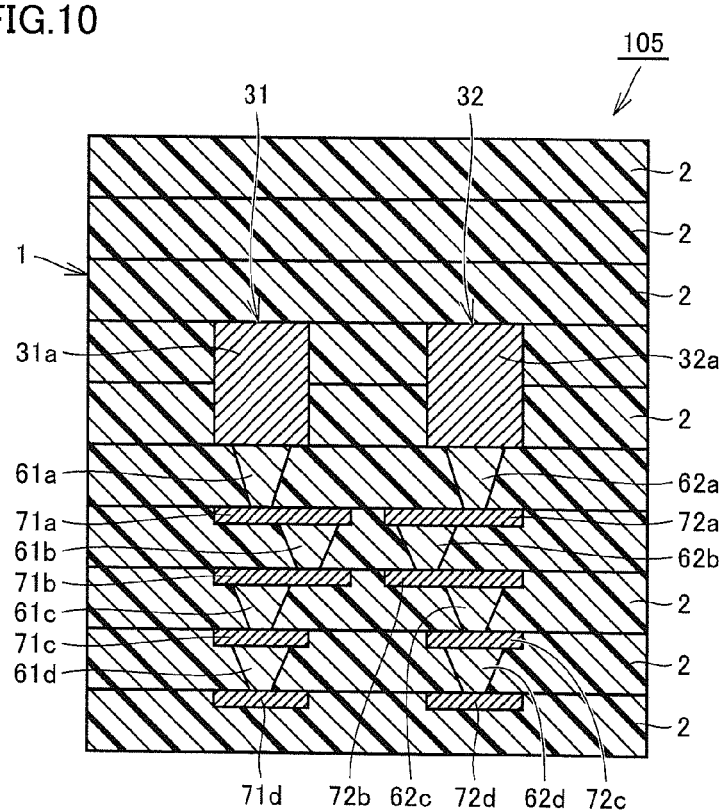
FIG. 10 is a cross-sectional view taken along the line X-X with arrows in FIG. 9.

A resin multilayer substrate according to a fifth preferred embodiment of the present invention will be described with reference to FIGS. 9 and 10. FIG. 9 is a see-through plan view of a resin multilayer substrate 105 according to the present preferred embodiment. FIG. 10 illustrates a cross-sectional view taken along the line X-X with arrows in FIG. 9.

The resin multilayer substrate 105 in the present preferred embodiment has a similar structure to that in the third preferred embodiment. In this structure, when seen in plan view, the two serial via sections connected to the first component 31 and the two serial via sections connected to the second component 32 are asymmetric.

The present preferred embodiment provides the same or substantially the same advantages as those in the third preferred embodiment.

Sixth Preferred Embodiment

Figure 11:
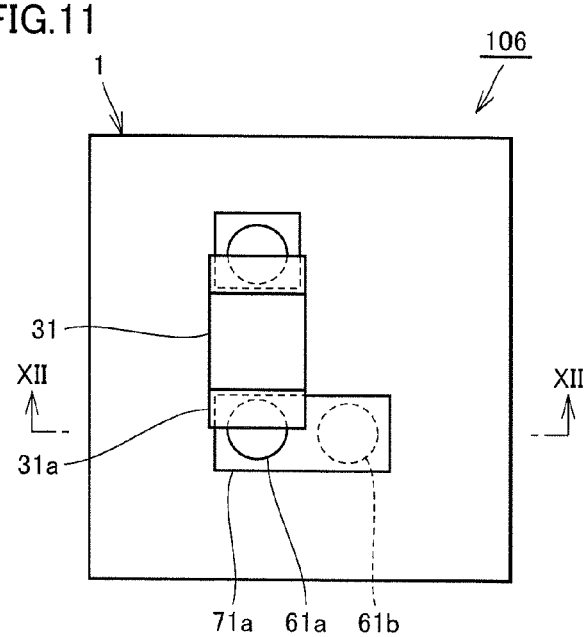
FIG. 11 is a see-through plan view of a resin multilayer substrate according to a sixth preferred embodiment of the present invention.
Figure 12:
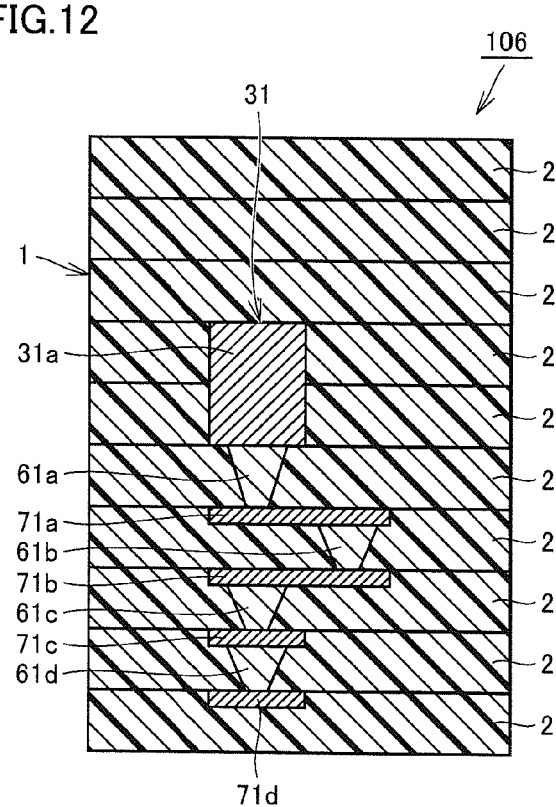
FIG. 12 is a cross-sectional view taken along the line XII-XII with arrows in FIG. 11.

A resin multilayer substrate according to a sixth preferred embodiment of the present invention will be described with reference to FIGS. 11 and 12. FIG. 11 is a see-through plan view of a resin multilayer substrate 106 according to the present preferred embodiment. FIG. 12 illustrates a cross-sectional view taken along the line XII-XII with arrows in FIG. 11.

The resin multilayer substrate 106 in the present preferred embodiment includes the multilayer body 1, the first component 31, the conductive vias 61a, 61c, and 61d (the plurality of first conductive vias), and the conductive via 61b (the second conductive via). The multilayer body 1 includes the plurality of resin layers 2 mainly made of thermoplastic resin that are laminated. The first component 31 is incorporated in the multilayer body 1 and includes the first component terminal 31a. The conductive vias 61a, 61c, and 61d are electrically connected to the first component terminal 31a and overlap the first component terminal 31a as seen from the laminating direction of the multilayer body 1. The conductive via 61b is not aligned with the first conductive vias vertically with respect to the laminating direction, is positioned at a height different from the first conductive vias, and is electrically connected to the first conductive vias.

The first component terminal 31a and the conductive via 61a are directly connected to each other without a planar conductive pattern interposed therebetween. The lower end of the conductive via 61a is connected to the conductive pattern 71a. The conductive pattern 71a extends laterally. The lower surface of the conductive pattern 71a is connected to the conductive via 61b. The lower end of the conductive via 61b is connected to the conductive pattern 71b. The lower surface of the conductive pattern 71b is connected to the conductive via 61c. The lower end of the conductive via 61c is connected to the conductive via 61d with the conductive pattern 71c interposed therebetween. The lower end of the conductive via 61d is connected to the conductive pattern 71d. The conductive vias 61c and 61d overlap the conductive via 61a as seen in plan view. The conductive via 61b does not overlap the conductive via 61a, 61c, or 61d as seen in plan view. In this example, the conductive vias 61a, 61c, and 61d correspond to the first conductive vias. The number of conductive vias corresponding to the first conductive vias is preferably two or more, for example. The number of conductive vias corresponding to the first conductive vias is not limited to three and may be two, four, or more.

In the present preferred embodiment, electrical short circuiting between the first component 31 and other elements inside the multilayer body 1 is prevented.

The above-described preferred embodiments illustrate examples in which one or two incorporated components are used. The number of incorporated components may be three or more.

In the above-described preferred embodiments, each of the incorporated components preferably has a rectangular or substantially rectangular parallelepiped shape and includes outer electrodes defining terminals at both ends. The incorporated component may have other suitable structures.

The sizes of the first component and second component may be the same or different. The same applies to their shapes.

A plurality of the above-described preferred embodiments may be combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a multilayer body including a plurality of resin layers mainly made of thermoplastic resin and that are laminated;
a first component incorporated in the multilayer body and including a first component terminal;
a second component incorporated in the multilayer body, including a second component terminal, and spaced away from the first component as seen from a laminating direction of the multilayer body;
a first conductive via electrically connected to the first component terminal and overlapping the first component terminal as seen from the laminating direction of the multilayer body;
a plurality of second conductive vias, all of which are not aligned with the first conductive via, disposed closer to the second component, disposed at heights different from a height of the first conductive via, and electrically connected to the first conductive via;
a first planar conductive pattern electrically connected to the first conductive via and one of the plurality of second conductive vias and overlapping the first component terminal as seen from the laminating direction of the multilayer body; and
a plurality of second planar conductive patterns, all of which are electrically connected to the plurality of second conductive vias and do not overlap the first component terminal and the second component terminal as seen from the laminating direction of the multilayer body.

2. The resin multilayer substrate according to claim 1, wherein the first planar conductive pattern is provided between the first conductive via and one of the second conductive vias.

3. The resin multilayer substrate according to claim 1, further comprising a third conductive via electrically connected to the second component terminal and overlapping the second component terminal as seen from the laminating direction of the multilayer body.

4. The resin multilayer substrate according to claim 3, further comprising a fourth conductive via not aligned with the third conductive via, disposed closer to the first component, disposed at a height different from a height of the third conductive via, and electrically connected to the third conductive via.

5. The resin multilayer substrate according to claim 1, wherein the plurality of second conductive vias are continuously and linearly disposed in the laminating direction.

6. A resin multilayer substrate comprising:
a multilayer body including a plurality of resin layers mainly made of thermoplastic resin and that are laminated;
a first component incorporated in the multilayer body and including a first component terminal;
a second component incorporated in the multilayer body, including a second component terminal, and spaced away from the first component as seen from a laminating direction of the multilayer body;
a plurality of first conductive vias electrically connected to the first component terminal and overlapping the first component terminal as seen from the laminating direction of the multilayer body;
a second conductive via not aligned with the first conductive vias, disposed closer to the second component, disposed at a height different from heights of the first conductive vias, and electrically connected to the first conductive vias;
a first planar conductive pattern electrically connected to one of the plurality of first conductive vias and the second conductive via and overlapping the first component terminal as seen from the laminating direction of the multilayer body; and
a plurality of second planar conductive patterns, all of which are electrically connected to the plurality of first conductive vias and do not overlap the second conductive via as seen from the laminating direction of the multilayer body.

7. The resin multilayer substrate according to claim 6, wherein at least one planar conductive pattern including the first planar conductive pattern is provided between one of the first conductive vias and the second conductive via.

8. The resin multilayer substrate according to claim 6, further comprising a third conductive via electrically connected to the second component terminal and overlapping the second component terminal as seen from the laminating direction of the multilayer body.

9. The resin multilayer substrate according to claim 8, further comprising a fourth conductive not aligned with the third conductive via, disposed closer to the first component, disposed at a height different from a height of the third conductive via, and electrically connected to the third conductive via.

10. The resin multilayer substrate according to claim 1, wherein the plurality of first conductive vias are continuously and linearly disposed in the laminating direction.

11. The resin multilayer substrate according to claim 1, wherein the plurality of first conductive vias are discontinuously and linearly disposed in the laminating direction.

12. A resin multilayer substrate comprising:
a multilayer body including a plurality of resin layers mainly made of thermoplastic resin and that are laminated;
a first component incorporated in the multilayer body and including a first component terminal;
a plurality of first conductive vias electrically connected to the first component terminal and overlapping the first component terminal as seen from a laminating direction of the multilayer body;
a second conductive via not aligned with the first conductive vias vertically with respect to the laminating direction, disposed at a height different from heights of the first conductive vias, and electrically connected to the first conductive vias;
a first planar conductive pattern electrically connected to one of the plurality of first conductive vias and the second conductive via and overlapping the first component terminal as seen from the laminating direction of the multilayer body; and
a plurality of second planar conductive patterns, all of which are electrically connected to the plurality of first conductive vias and do not overlap the second conductive via as seen from the laminating direction of the multilayer body.

13. The resin multilayer substrate according to claim 1, wherein the plurality of first conductive vias extend continuously and linearly in the laminating direction.

* * * * *